United States Patent
Gill

(10) Patent No.: US 7,397,638 B2
(45) Date of Patent: Jul. 8, 2008

(54) MAGNETORESISTIVE SENSOR HAVING AN IN STACK BIAS STRUCTURE WITH NIFECR SPACER LAYER FOR IMPROVED BIAS LAYER PINNING

(75) Inventor: Hardayal Singh Gill, Palo Alto, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 348 days.

(21) Appl. No.: 11/187,564

(22) Filed: Jul. 22, 2005

(65) Prior Publication Data
US 2007/0019342 A1    Jan. 25, 2007

(51) Int. Cl.
*G11B 5/39* (2006.01)
(52) U.S. Cl. .................................. 360/324.12
(58) Field of Classification Search ............. 360/324.1, 360/324.11, 324.12, 324.2
See application file for complete search history.

(56) References Cited

U.S. PATENT DOCUMENTS

| | | | |
|---|---|---|---|
| 5,731,936 A | 3/1998 | Lee et al. ................... | 360/113 |
| 6,023,395 A | 2/2000 | Dill et al. ................... | 360/113 |
| 6,114,719 A | 9/2000 | Dill et al. ................... | 257/295 |
| 6,166,948 A | 12/2000 | Parkin et al. ............... | 365/173 |
| 6,195,239 B1 | 2/2001 | Araki et al. ............. | 360/324.11 |
| 6,222,707 B1 | 4/2001 | Huai et al. ............... | 360/324.1 |
| 6,438,026 B2 | 8/2002 | Gillies et al. ............... | 365/158 |
| 6,466,419 B1 | 10/2002 | Mao ....................... | 360/324.12 |
| 6,556,392 B1 | 4/2003 | Mao et al. .............. | 360/324.12 |
| 6,700,760 B1 | 3/2004 | Mao ....................... | 360/324.2 |
| 7,075,760 B2 * | 7/2006 | Gill ........................ | 360/324.12 |
| 7,106,561 B2 * | 9/2006 | Carey et al. ............ | 360/324.12 |
| 7,162,791 B2 * | 1/2007 | Ju et al. ................... | 29/603.14 |
| 7,224,556 B2 * | 5/2007 | Pinarbasi ................ | 360/324.11 |
| 7,259,942 B2 * | 8/2007 | Childress et al. ........ | 360/324.12 |
| 7,265,947 B2 * | 9/2007 | Zheng et al. ............ | 360/324.12 |
| 7,283,336 B2 * | 10/2007 | Gill ........................ | 360/324.12 |
| 2003/0156362 A1 | 8/2003 | Gill ........................ | 360/324.12 |

(Continued)

OTHER PUBLICATIONS

Michael K. Ho, Ching Tsang, Jeff Childress, Robert Fontana, Jordan Katine, an Kashmira Carey, "Study of Longitudinal Stabilizations Using In-Stack Biasing," Jan. 2004, IEEE Transactions on Magnetics, vol. 40, No. 1.

(Continued)

*Primary Examiner*—Jefferson Evans
(74) *Attorney, Agent, or Firm*—Zilka-Kotab, PC

(57) ABSTRACT

A magnetoresistive sensor having an in stack bias structure for biasing the magnetic moment of the free layer. The in stack bias structure includes a magnetic bias layer that may include a layer of NiFe and a layer of CoFe. A layer of antiferromagnetic material (AFM layer) is exchange coupled with the bias layer. Preferably, the NiFe layer of the bias layer is located adjacent to the AFM layer. A non-magnetic spacer layer is sandwiched between the free layer and the bias layer. The spacer layer comprises NiFeCr and is of such a thickness that magnetostatic coupling between the free layer and the bias layer across the spacer layer biases the magnetic moment of the free layer in a direction antiparallel to the magnetic moment of the bias layer. The NiFeCr promotes a desired crystalline growth in the bias layer that causes excellent exchange coupling between the bias layer and the AFM layer.

20 Claims, 3 Drawing Sheets

U.S. PATENT DOCUMENTS

2005/0024793 A1* 2/2005 Nakabayashi et al. .. 360/324.11
2006/0002042 A1* 1/2006 Gill ....................... 360/324.12
2007/0109692 A1* 5/2007 Carey et al. ............. 360/324.1

OTHER PUBLICATIONS

K.M.H. Lenssen, C. Giebeler, and A.E.T. Kuiper, "Improving Magnetoresistance Characteristics by Toppings," Jul. 2001, IEEE Transactions on Magnetics, vol. 37, No. 4.

Y. Hamakawa, M. Komuro, K. Watanabe, H. Hoshiya, T. Okada, K. Nakamoto, Y. Suzuki, F. Fuyama, and H. Fukui, "Spin-Valve Heads Using CrMnPt Antiferromagnetic Films," Mar. 1999, IEEE Transactions on Magnetics, vol. 35, No. 2.

M. Hatatani, K. Hoshino, H. Hoshiya, T. Shintani, K. Watanabe, K. Nakamoto, H. Tanaka and H. Ide, Read Performance of GMR Heads with In-Stack Longitudinal Bias Layer, May, 2003, Journal of Applied Physics, vol. 93, No. 10.

M.J. Carey, A. Kellock, L. Baril, J.R. Childress, T. Le, T. Thompson, and B.A. Gurney, "Improved Corrosion Resistance of IrMn by Cr and Ru Additions," Dec. 2002, Applied Physics Letters, vol. 81, No. 27.

* cited by examiner

MAGNETORESISTIVE SENSOR HAVING AN IN STACK BIAS STRUCTURE WITH NIFECR SPACER LAYER FOR IMPROVED BIAS LAYER PINNING

FIELD OF THE INVENTION

The present invention relates to current perpendicular to plane (CPP) magnetoresistive sensors having a novel in stack free layer bias structure that provides improved free layer stability.

BACKGROUND OF THE INVENTION

The heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to cos $\theta$, where $\theta$ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

When a spin valve sensor employs a single pinned layer it is referred to as a simple spin valve. When a spin valve employs an antiparallel (AP) pinned layer it is referred to as an AP pinned spin valve. An AP spin valve includes first and second magnetic layers separated by a thin non-magnetic coupling layer such as Ru. The thickness of the spacer layer is chosen so as to antiparallel couple the magnetizations of the ferromagnetic layers of the pinned layer. A spin valve is also known as a top or bottom spin valve depending upon whether the pinning layer is at the top (formed after the free layer) or at the bottom (before the free layer).

The spin valve sensor is located between first and second nonmagnetic electrically insulating read gap layers and the first and second read gap layers are located between ferromagnetic first and second shield layers. In a merged magnetic head a single ferromagnetic layer functions as the second shield layer of the read head and as the first pole piece layer of the write head. In a piggyback head the second shield layer and the first pole piece layer are separate layers.

Magnetization of the pinned layer is usually fixed by exchange coupling one of the ferromagnetic layers (AP1) with a layer of antiferromagnetic material such as PtMn. While an antiferromagnetic (AFM) material such as PtMn does not in and of itself have a magnetization, when exchange coupled with a magnetic material, it can strongly pin the magnetization of the ferromagnetic layer.

In order to meet the ever increasing demand for improved data rate and data capacity, researchers have recently been focusing their efforts on the development of perpendicular recording systems. A traditional longitudinal recording system stores data as magnetic bits oriented longitudinally along a track in the plane of the surface of the magnetic disk. This longitudinal data bit is recorded by a fringing field that forms between a pair of magnetic poles separated by a write gap. A perpendicular recording system, on the other hand, records data as magnetic transitions oriented perpendicular to the plane of the magnetic disk. The magnetic disk has a magnetically soft underlayer covered by a thin magnetically hard top layer. The perpendicular write head has a write pole with a very small cross section and a return pole having a much larger cross section. A strong, highly concentrated magnetic field emits from the write pole in a direction perpendicular to the magnetic disk surface, magnetizing the magnetically hard top layer. The resulting magnetic flux then travels through the soft underlayer, returning to the return pole where it is sufficiently spread out and weak that it will not erase the signal recorded by the write pole.

The advent of perpendicular recording systems has lead to an increased interest in current perpendicular to plane (CPP) sensors, which are particularly suited to use in perpendicular recording systems, due to their ability to read signals from a high coercivity medium. This is in part due to the short gap height afforded by such CPP sensors which allows them to read a very short bit of data. A CPP sensor differs from a more conventional current in plane (CIP) sensor such as that discussed above in that the sense current flows through the CPP sensor from top to bottom in a direction perpendicular to the plane of the layers making up the sensor. Whereas the more traditional CIP sensor has insulation layers separating it from the shields, the CPP sensor contacts the shields at its top and bottom surfaces, thereby using the shields as leads.

A challenge to constructing a practical CPP GMR sensor is the necessity of having an insulation layer at either side of the sensor. In a CPP sensor, sense current is conducted from the top of the sensor to the bottom of the sensor perpendicular to the plane of the layers by leads that also may act as magnetic shields. In order to prevent current from being shunted from one lead to the other across the hard bias layers that typically extend from the sides of the sensor an insulation layer must be provided to cover the sides of the sensor and at least one of the leads. This insulation layer weakens the magnetostatic coupling between the bias layer and the free layer. Therefore, traditional hard bias layers, formed at either side of the sensor, are less effective in a CPP sensor.

One way to overcome the drawbacks of such hard bias layers in a CPP sensor design is to construct an in stack bias structure. In stack bias structures that have been proposed include a layer of magnetic material such as NiFe separated from the free layer by a spacer layer such as Ta. The magnetic layer, or biasing layer, is then exchange coupled with a layer of antiferromagnetic material (AFM layer) such as PtMn. Unfortunately however, in order to provide significant biasing, the magnetic layer (bias layer) must be very thick. For example, the bias layer must be 1.5 to 2 times the thickness of the free layer. The AFM layer itself must also be very thick, even thicker than the bias layer.

Unfortunately, such a thick magnetic layer exhibits poor exchange coupling with the AFM layer. This exchange coupling of the bias layer with the free layer is further degraded by the epitaxial growth of the bias and AFM layer when grown on top of a spacer layer such as Cu, or a barrier layer such as alumina or MgO (in the case of a tunnel valve). Strong exchange coupling depends greatly on the crystal structure of the materials on which it is deposited. The crystalline structure of the underlying layers tends to continue into the bias and AFM layers. When used in a pinning layer, such AFM layers are generally deposited on a seed layer that promotes a desired crystalline growth in the AFM layer and, therefore, into the later applied magnetic layer (pinned layer). However, a magnetic free layer does not provide this optimal grain structure when a bias layer and an AFM layer are deposited over the free layer.

Therefore, there is a strong felt need for a practical in stack bias structure that can provide sufficiently strong exchange coupling between the AFM layer and an adjacent bias layer to maintain robust biasing in a magnetoresistive sensor. Such a bias structure would also have to provide such robust exchange coupling without negatively affecting the magnetic properties of the free layer such as spin dependent electron scattering.

SUMMARY OF THE INVENTION

The present invention provides a magnetoresistive sensor having an in stack bias structure with improved exchange coupling. The sensor includes a free layer, a pinned layer and a first non-magnetic layer sandwiched between the free and pinned layers. A hard bias structure is provided, that includes a magnetic bias layer that is exchange coupled with a layer of antiferromagnetic material (AFM layer), and may include a second non-magnetic layer, such as, for example NiFeCr, sandwiched between the free layer and the bias layer.

The NiFeCr layer which may be sandwiched between the free layer and the bias layer can advantageously provide an excellent seed layer for growth of the bias layer.

The bias layer can include a layer of CoFe and a layer of NiFe, and when grown on top of the NiFeCr layer it exhibits excellent exchange coupling with the AFM layer, which may be for example IrMn.

This improved exchange coupling ensures that free layer biasing will be maintained even in the event of a heat spike, such as from a head disk contact or electrostatic discharge.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
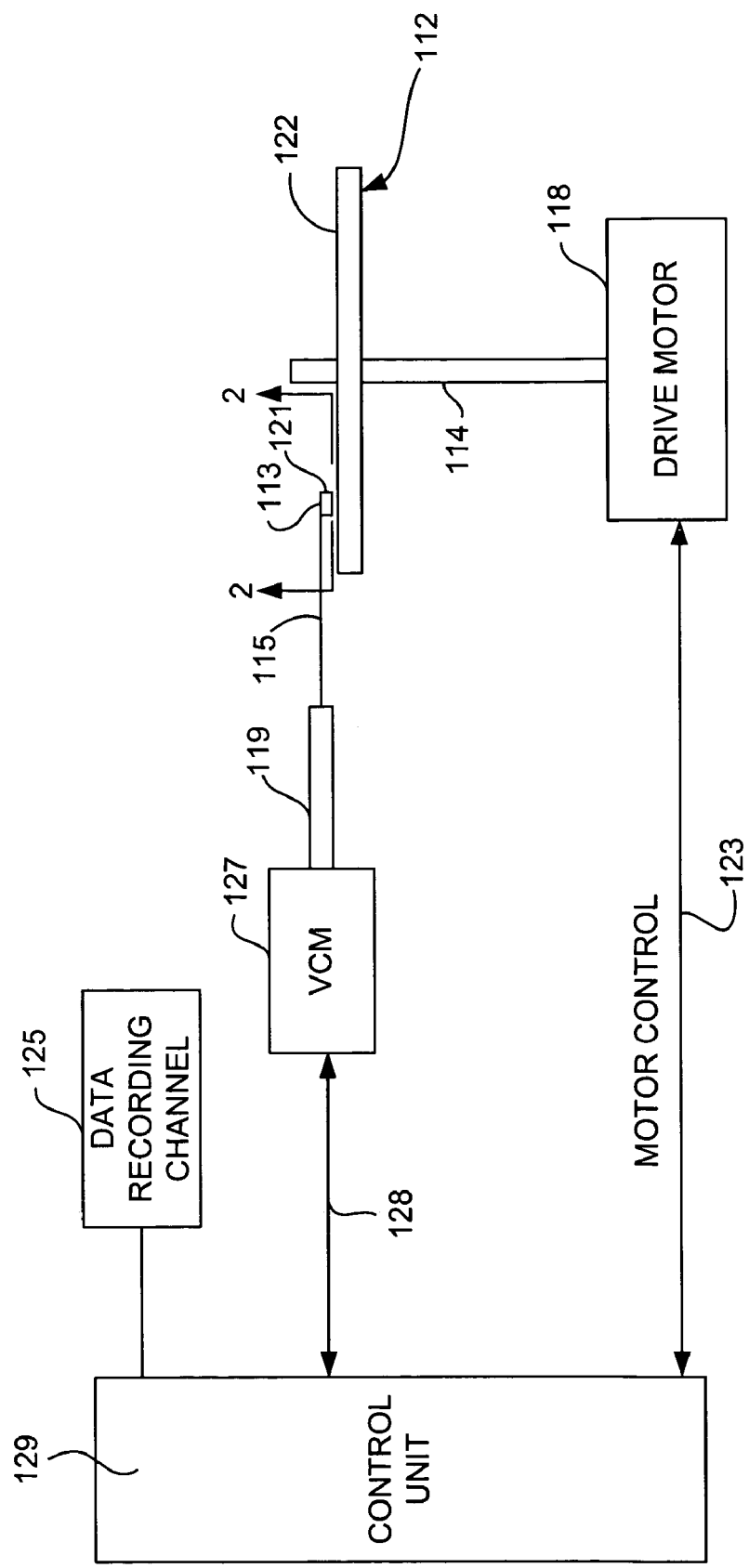
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
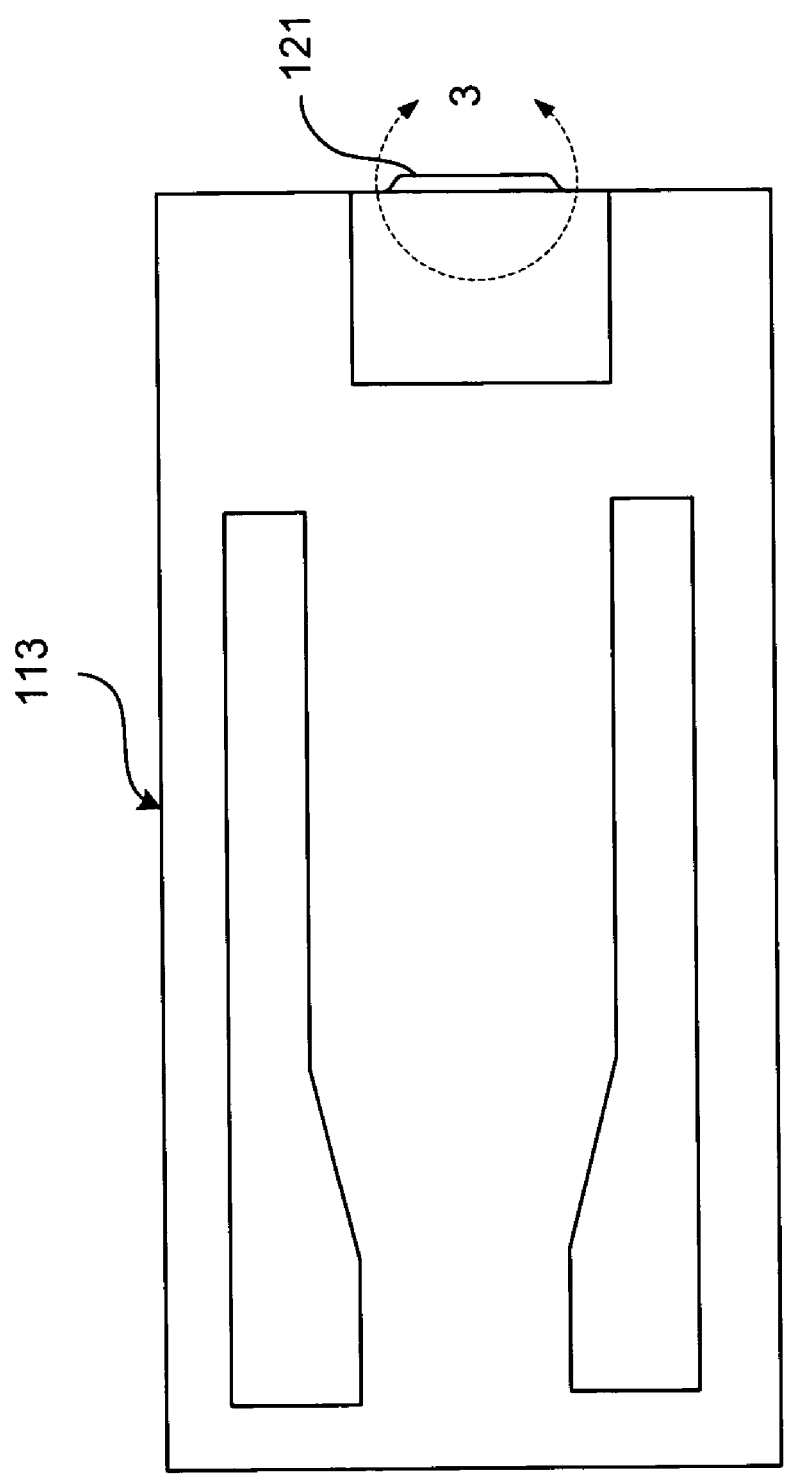
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
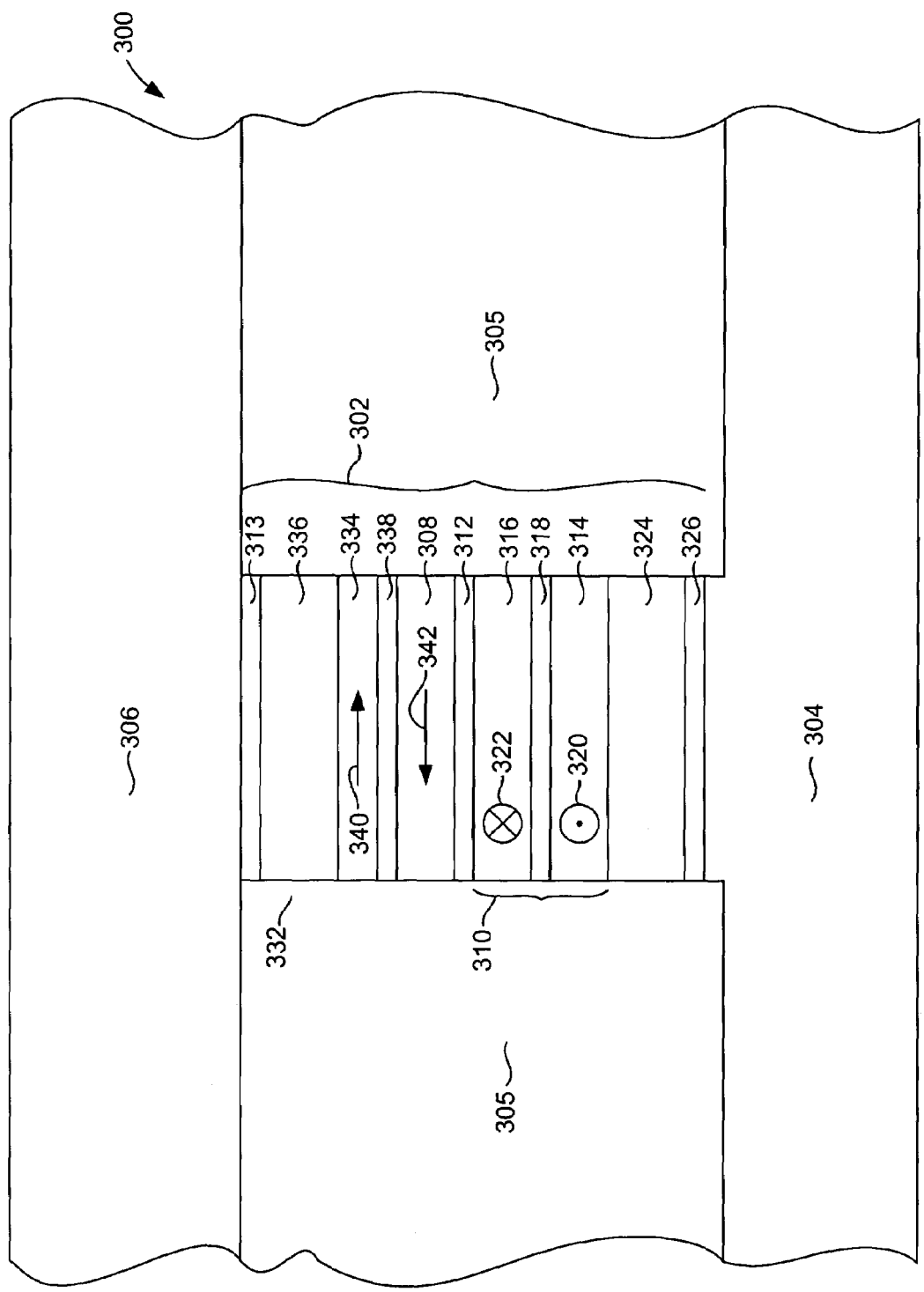
FIG. 3 is an ABS view of a magnetic sensor according to an embodiment of the present invention taken from circle 3 of FIG. 2 and rotated 90 degrees clockwise.

With reference now to FIG. 3, a magnetoresistive sensor 300 according to an embodiment of the invention includes a magnetoresistive sensor element or sensor stack 302, sandwiched between first and second leads 304, 306. The first and second leads 304, 306 can be constructed of an electrically conductive, magnetic material such as NiFe and can thereby serve as magnetic shields as well as leads. Non-magnetic, electrically insulating gap material 305 fills the space between the shields 304, 306 outside of the sensor stack 302.

The sensor stack 302 includes a magnetic free layer structure 308 and a magnetic pinned layer structure 310. A non-magnetic, electrically conductive spacer layer 312 such as Cu is sandwiched between the free and pinned layers. It should be pointed out that the present invention is being described as a current perpendicular to plane GMR sensor, however, the present invention could also be embodied in a tunnel valve sensor, in which case a non-magnetic, electrically insulating barrier layer such as alumina would be sandwiched between the free and pinned layers 308, 310 rather than the electrically conductive spacer layer 312.

The pinned layer 310 may be an antiparallel coupled (AP coupled) pinned layer having a first magnetic layer AP1 314, and a second magnetic layer AP2 316, both of which are antiparallel coupled across an AP coupling layer 318 such as Ru. The AP1 and AP2 layers 314,316 may be constructed of CoFe. The magnetic moment 320, 322 of each of the AP1 and AP2 layers 314,316 can be pinned by a layer of antiferromagnetic material (first AFM layer) 324 that is exchange coupled with the AP1 layer 314. The AFM layer 324 may be constructed of several materials such as PtMn or IrMn and is preferably PtMn. A seed layer 326 may be provided at the bottom of the sensor stack 302 to initiate a desired grain growth in the sensor stack 302. A capping layer 313, such as Ta may be provided at the top of the sensor stack 302 to protect the layers of the sensor stack 302 from damage during manufacture. It should be pointed out that, although the sensor 300 is being described as a current perpendicular to plane (CPP) sensor, the invention could also be embodied in a current in plane (CIP) sensor. In that case, the insulation 305 would be replaced with electrically conductive leads, such as Au, Cu or Rh extending from the sides of the sensor, and the first and second leads 304, 306 would be replaced with non-magnetic, electrically insulating gap layers such as alumina.

With continued reference to FIG. 3, the sensor stack 302 includes an in stack bias structure 332. The in stack bias structure 332 includes a magnetic bias layer 334 that is exchange coupled with a layer of antiferromagnetic material (second AFM) 336. The bias layer is separated from the free layer 308 by spacer layer 338. The bias layer 334 can be constructed of several magnetic materials such as CoFe, NiFe, CoB, CoSiB, CoNb or some other material. The bias layer is preferably constructed of a layer of NiFe and a layer of CoFe with the CoFe layer being disposed adjacent to the second AFM layer 336. Having the CoFe layer adjacent to the second AFM layer is important for promoting strong exchange coupling between the bias layer 334 and the second AFM layer 336, and the CoFe has a high magnetic moment for providing a strong bias field for biasing the free layer.

The use of a negative magnetostrictive material for the bias layer 332 (e.g., NiFe, CoB, CoSiB or CoNb) will further improve the pinning strength by stress induced anisotropy caused by the compressive stress at the air bearing surface. These additional Co-based amorphous materials also provide stronger pinning with an IrMn antiferromagnet, which is a preferred material for bias layer pinning.

As those skilled in the art will appreciate, the magnetic thickness of a magnetic layer can be defined as the physical thickness of the magnetic layer multiplied by the magnetic coercivity of the layer. With this in mind, the bias layer 334 preferably has a magnetic thickness that is about 1-3 times or may be about 2 times the magnetic thickness of the spacer layer, in order to ensure that the bias layer 334 will provide sufficient bias field to maintain biasing of the moment 342 of the free layer 308. This also means that the physical thickness of the bias layer 334 may be 1-3 times or about 2 times the thickness of the free layer 308, although the magnetic thickness is the more important parameter.

According to the present invention, the spacer layer 312 comprises NiFeCr, preferably having a Cr content of about 40 atomic percent. More preferably, the spacer layer 312 comprises $(Ni_{80}Fe_{20})_{60}Cr_{40}$. The spacer layer 338 is a non-magnetic, electrically conductive material, and preferably has a thickness of about 20 Angstroms. The free layer 308 is magnetostatically coupled with the bias layer 334. As mentioned above, the bias layer 334 is exchange coupled with the second AFM layer 336. This pins the magnetic moment 340 of the bias layer 334 in a first direction parallel with the ABS as shown. The magnetostatic coupling between the free layer 308 and the bias layer 334 biases the moment 342 of the free layer in a second direction antiparallel with the moment 340 and parallel with the ABS as shown.

The NiFeCr spacer layer 334 not only has advantageous non-magnetic, electrically conductive properties, but also promotes strong exchange coupling between the bias layer and the second AFM layer. The NiFeCr has a desired crystallographic structure, and provides larger grains for stronger exchange coupling strength. This grains structure carries through to the bias layer 334 and second AFM layer 336 deposited thereon.

The resulting increased exchange coupling strength provided by the present invention ensures increased free layer biasing robustness. However, this improved exchange coupling also allows the AFM layer 336 to be constructed thinner than would otherwise be the case. This decreased thickness of the AFM layer 336 advantageously decreases gap thickness and also decreases parasitic resistance from the AFM layer 336. While the AFM layer could be constructed of several antiferromagnetic materials such as PtMn, it is preferably constructed of IrMn which has been found to exhibit preferable resistance to loss of pinning during events such as a head disk contact or electrostatic discharge. The exchange coupling of IrMn has also been found to react very favorably to the presence of the NiFeCr spacer layer, as discussed previously.

What is claimed is:

1. A magnetoresistive sensor, comprising:
   magnetic free layer;
   a magnetic pinned layer;
   a first non-magnetic layer sandwiched between the pinned layer and the free layer;
   an in stack magnetic bias layer;
   a layer of antiferromagnetic material exchange coupled with the in stack bias layer; and
   a second non-magnetic layer sandwiched between the in stack bias layer and the free layer, the second non-magnetic layer comprising NiFeCr; wherein
   the second non-magnetic layer has a Cr content of about 40 atomic percent.

2. A sensor as in claim 1 wherein the second non-magnetic layer comprises $(Ni_{80}Fe_{20})_{60}Cr_{40}$.

3. A sensor as in claim 1 wherein the second non-magnetic layer has a thickness of 20 Angstroms.

4. A sensor as in claim 1 wherein the layer of antiferromagnetic material comprises IrMn.

5. A sensor as in claim 1 wherein the layer of antiferromagnetic material comprises PtMn.

6. A sensor as in claim 1 wherein the in stack bias structure comprises NiFe.

7. A sensor as in claim 1 wherein the in stack bias structure comprises CoFe.

8. A sensor as in claim 1 wherein the bias layer and the free layer each have a thickness, and wherein the thickness of the bias layer is 1-3 times the thickness of the free layer.

9. A sensor as in claim 1 wherein the bias layer and the free layer each have a magnetic thickness that is the thickness of the respective layer multiplied by the magnetic moment of the respective layer, and wherein the magnetic thickness of the bias layer is 1-3 times the magnetic thickness of the free layer.

10. A sensor as in claim 1 wherein the bias layer and the free layer each have a magnetic thickness that is the thickness of the respective layer multiplied by the magnetic moment of the respective layer, and wherein the magnetic thickness of the bias layer is about 2 times the magnetic thickness of the free layer.

11. A sensor as in claim 1 wherein the first non-magnetic layer is an electrically insulating barrier layer.

12. A sensor as in claim 1 wherein the sensor is a current perpendicular to plane magnetoresistive sensor.

13. A sensor as in claim 1 further comprising a second layer of antiferromagnetic material exchange coupled with the pinned layer structure to pin a magnetic moment of the pinned layer.

14. A sensor as in claim 1 further comprising a second layer of antiferromagnetic material exchange coupled with the pinned layer structure to pin a magnetic moment of the pinned layer, and wherein the second layer of antiferromagnetic material is a different material than that of the antiferromagnetic layer that is exchange coupled with the bias layer.

15. A sensor as in claim 1 further comprising a second layer of antiferromagnetic material exchange coupled with the pinned layer structure to pin a magnetic moment of the pinned layer, and wherein the second layer of antiferromagnetic material comprises PtMn and the antiferromagnetic layer that is exchange coupled with the bias layer comprises IrMn.

16. A magnetoresistive sensor, comprising:
    magnetic free layer;
    a magnetic pinned layer;
    a first non-magnetic layer sandwiched between the pinned layer and the free layer;
    an in stack magnetic bias layer;
    a layer of antiferromagnetic material exchange coupled with the in stack bias layer; and
    a second non-magnetic layer sandwiched between the in stack bias layer and the free layer, the second non-magnetic layer comprising NiFeCr; wherein the in stack bias structure comprises a layer comprising CoFe and a layer comprising NiFe.

17. A sensor as in claim 16 wherein the is located adjacent to the layer of antiferromagnetic material.

18. A magnetoresistive sensor, comprising;
    magnetic free layer;
    a magnetic pinned layer;
    a first non-magnetic layer sandwiched between the pinned layer and the free layer;
    an in stack magnetic bias layer;
    a layer of antiferromagnetic material exchange coupled with the in stack bias layer; and
    a second non-magnetic layer sandwiched between the in stack bias layer and the free layer, the second non-magnetic layer comprising NiFeCr; wherein the first non-magnetic layer is an electrically conductive spacer layer.

19. A magnetoresistive sensor, comprising;
    magnetic free layer;
    a magnetic pinned layer;
    a first non-magnetic layer sandwiched between the pinned layer and the free layer;
    an in stack magnetic bias layer;
    a layer of antiferromagnetic material exchange coupled with the in stack bias layer; and
    a second non-magnetic layer sandwiched between the in stack bias layer and the free layer, the second non-magnetic layer comprising NiFeCr; wherein the sensor is a current in plane sensor.

20. A magnetic data recording system, comprising:
    a magnetic medium;
    an actuator;
    a slider, connected with the magnetic medium for movement adjacent to a surface of the magnetic medium; and
    a magnetoresistive sensor connected with the slider, the magnetoresistive sensor comprising:
    a magnetic pinned layer;
    a first non-magnetic layer sandwiched between the pinned layer and the free layer;
    an in stack magnetic bias layer;
    a layer of antiferromagnetic material exchange coupled with the in stack bias layer; and
    a second non-magnetic layer sandwiched between the in stack bias layer and the free layer, the second non-magnetic layer comprising NiFeCr; wherein
    the second non-magnetic layer has a Cr content of about 40 atomic percent.

* * * * *